(12) United States Patent
Kondo

(10) Patent No.: US 11,031,474 B2
(45) Date of Patent: Jun. 8, 2021

(54) SEMICONDUCTOR DEVICE

(71) Applicant: TOSHIBA MEMORY CORPORATION, Tokyo (JP)

(72) Inventor: Yoshiyuki Kondo, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/278,023

(22) Filed: Feb. 15, 2019

(65) Prior Publication Data

US 2020/0066846 A1 Feb. 27, 2020

(30) Foreign Application Priority Data

Aug. 24, 2018 (JP) ............................. JP2018-157063

(51) Int. Cl.
*H01L 29/167* (2006.01)
*H01L 29/66* (2006.01)
*H01L 29/78* (2006.01)

(52) U.S. Cl.
CPC ........ *H01L 29/167* (2013.01); *H01L 29/6656* (2013.01); *H01L 29/66643* (2013.01); *H01L 29/78* (2013.01)

(58) Field of Classification Search
CPC ............... H01L 29/6656; H01L 29/167; H01L 29/66643; H01L 29/78
See application file for complete search history.

(56) References Cited

U.S. PATENT DOCUMENTS

| 6,051,509 A | * | 4/2000 | Tsuchiaki | .......... H01L 21/26506 |
| | | | | 438/758 |
| 7,169,675 B2 | | 1/2007 | Tan et al. | |
| 7,687,337 B2 | * | 3/2010 | Zhang | .................... H01L 29/165 |
| | | | | 257/E21.615 |
| 7,767,534 B2 | * | 8/2010 | Yang | .................. H01L 29/66636 |
| | | | | 438/299 |
| 7,985,985 B2 | | 7/2011 | Hokazono | |
| 8,076,731 B2 | | 12/2011 | Awano | |
| 8,134,189 B2 | * | 3/2012 | Tamura | ........... H01L 21/823807 |
| | | | | 257/288 |
| 8,927,375 B2 | * | 1/2015 | Alptekin | ........... H01L 21/02529 |
| | | | | 438/300 |
| 9,536,792 B2 | | 1/2017 | Lin et al. | |

(Continued)

FOREIGN PATENT DOCUMENTS

JP 2010-010587 A 1/2010
JP 2013-201387 A 10/2013

OTHER PUBLICATIONS

Rucker et al., "Suppressed diffusion of boron and carbon in carbon-rich silicon," Appl. Phys. Lett. 73, 1682 (1998).

*Primary Examiner* — Eugene Lee
(74) *Attorney, Agent, or Firm* — Foley & Lardner LLP

(57) ABSTRACT

A semiconductor device is provided with: a substrate; a first region provided above the substrate; a second region provided away from the first region in a first direction; a third region provided between the first region and the second region, the third region facing an electrode portion; a fourth region provided between the first region and the third region; and a fifth region provided between the second region and the third region. The fourth and fifth regions include carbon (C). Carbon concentrations in the first and second regions are lower than carbon concentrations in the fourth and fifth regions.

17 Claims, 6 Drawing Sheets

(56) References Cited

U.S. PATENT DOCUMENTS

| | | | |
|---|---|---|---|
| 2006/0148220 A1* | 7/2006 | Lindert | H01L 21/26513 438/514 |
| 2006/0174825 A1* | 8/2006 | Basceri | C30B 23/00 117/89 |
| 2006/0216900 A1* | 9/2006 | Wang | H01L 29/1083 438/306 |
| 2007/0072379 A1* | 3/2007 | Park | H01L 21/28518 438/287 |
| 2007/0164375 A1* | 7/2007 | Ohta | H01L 21/26506 257/408 |
| 2009/0050942 A1* | 2/2009 | Liu | H01L 21/26506 257/288 |
| 2009/0273034 A1* | 11/2009 | Woon | H01L 21/26506 257/368 |
| 2010/0012988 A1* | 1/2010 | Yang | H01L 21/26506 257/288 |
| 2013/0316509 A1* | 11/2013 | Qin | H01L 29/6653 438/289 |

* cited by examiner

SEMICONDUCTOR DEVICE

CROSS-REFERENCE TO RELATED APPLICATIONS

This application is based upon and claims the benefit of Japanese Patent Application No. 2018-157063, filed on Aug. 24, 2018, the entire contents of which are incorporated herein by reference.

BACKGROUND

Field

Embodiments described below relate to a semiconductor device.

Description of the Related Art

Miniaturization of semiconductor devices including a field effect transistor has been advanced.

DETAILED DESCRIPTION

A semiconductor device according to one embodiment is provided with: a substrate; a first region provided above the substrate; a second region provided away from the first region in a first direction; a third region provided between the first region and the second region, the third region facing an electrode; a fourth region provided between the first region and the third region; and a fifth region provided between the second region and the third region. The fourth and fifth regions include carbon (C). A carbon concentration in the first region and a carbon concentration in the second region are lower than a carbon concentration in the fourth region and a carbon concentration in the fifth region.

Next, semiconductor devices according to embodiments will be described in detail with reference to drawings. Note that the embodiments described below are mere examples and are not shown with the intention of limiting the present invention.

In the present specification, a lamination direction of a gate insulating film and a gate electrode laminated on a semiconductor portion will be referred to as a Z direction, and a direction vertical to the Z direction will be referred to as an X direction.

In the present specification, expressions such as "above", "below", "upper", "lower" and the like are based on the semiconductor portion and the gate electrode. For example, a direction from the semiconductor portion to the gate electrode along the Z direction is expressed as "upward", and a direction from the gate electrode to the semiconductor portion along the Z direction is expressed as "downward". When an upper surface and a lower surface are referred to for a certain component, the upper surface and the lower surface mean a surface facing upward and a surface facing downward, respectively, the surfaces intersecting with the Z direction. When an upper end and a lower end are referred to for a certain component, the upper end and the lower end mean an end portion located above the other parts of the component and an end portion located below the other parts of the component, respectively, the end portions being Z-direction end portions. A surface intersecting with the X direction will be referred to as a side surface.

First Embodiment

[Configuration]

Figure 1:
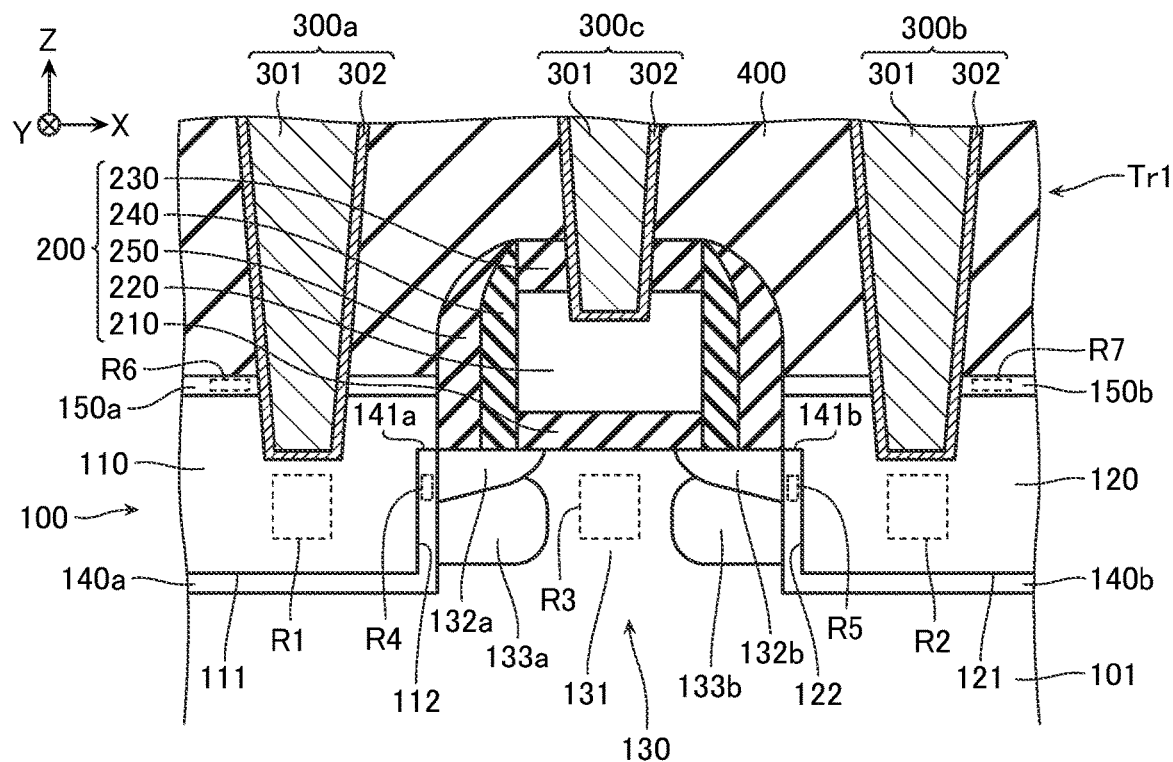
FIG. 1 is a schematic cross-sectional view showing a configuration of a semiconductor device according to a first embodiment.

Next, a configuration of a semiconductor device according to a first embodiment will be described with reference to FIG. 1. For convenience of explanation, some components will be omitted in FIG. 1.

The semiconductor device according to the present embodiment includes a P-channel type field effect transistor Tr1. The transistor Tr1 is provided with a semiconductor portion 100 and an electrode portion 200 arranged in the Z direction. The semiconductor device is further provided with contacts 300a and 300b connected to the semiconductor portion 100, a contact 300c connected to the electrode portion 200, and an insulating layer 400 covering the contacts 300a, 300b and 300c.

The semiconductor portion 100 includes a semiconductor substrate 101. The semiconductor portion 100 is further provided with a plurality of components arranged in the X direction. That is, the semiconductor portion 100 is provided with: a first semiconductor layer 110 connected to the contact 300a, a second semiconductor layer 120 connected to the contact 300b, a third semiconductor layer 130 provided between the first semiconductor layer 110 and the second semiconductor layer 120, a first silicon carbon layer 140a provided between the first semiconductor layer 110 and the third semiconductor layer 130, and a first silicon carbon layer 140b provided between the second semiconductor layer 120 and the third semiconductor layer 130. The semiconductor portion 100 is further provided with a second silicon carbon layer 150a provided between the first semiconductor layer 110 and the insulating layer 400, and a second silicon carbon layer 150b provided between the second semiconductor layer 120 and the insulating layer 400.

The semiconductor substrate 101 is, for example, a semiconductor substrate provided with an N-type well region and a P-type well region on its surface, and includes silicon (Si) and the like including impurities. The part shown in FIG. 1 is a part of the semiconductor substrate 101 where the N-type well region is provided. The N-type well region includes silicon (Si) and the like including N-type impurities such as phosphorus (P).

The first semiconductor layer 110 functions as a source region. The first semiconductor layer 110 is provided above the semiconductor substrate 101. The first semiconductor layer 110 includes, for example, silicon (Si) and the like including P-type impurities such as boron (B), and functions as a P-type semiconductor. Hereinafter, a partial region of the first semiconductor layer 110 may be referred to as a first region R1.

The second semiconductor layer 120 functions as a drain region. The second semiconductor layer 120 is provided above the semiconductor substrate 101. The second semiconductor layer 120 includes, for example, silicon (Si) and the like including P-type impurities such as boron (B), and functions as a P-type semiconductor. Hereinafter, a partial region of the second semiconductor layer 120 may be referred to as a second region R2.

The third semiconductor layer 130 is, for example, a part of the semiconductor substrate 101 and includes silicon (Si) and the like including N-type impurities such as phosphorus (P). The third semiconductor layer 130 includes a channel region 131 facing a gate electrode 220. An extension region 132a is provided between the channel region 131 and the first semiconductor layer 110, and a halo region 133a is provided below the extension region 132a. Similarly, an extension region 132b is provided between the channel region 131 and the second semiconductor layer 120, and a halo region 133b is provided below the extension region 132b.

The channel region 131 functions as an N-type semiconductor. Hereinafter, a part of the channel region 131 may be referred to as a third region R3. Note that the channel region 131 does not include boron (B) almost at all. At least a boron concentration in the third region R3 is lower than a boron concentration in the first semiconductor layer 110 and the second semiconductor layer 120.

The extension regions 132a and 132b, for example, reduce a threshold of the transistor Tr1. The extension regions 132a and 132b include, for example, P-type impurities such as boron (B), and function as P-type semiconductors. A concentration of the P-type impurities in the extension regions 132a and 132b is lower than a concentration of the P-type impurities in the first semiconductor layer 110 and the second semiconductor layer 120.

The halo regions 133a and 133b, for example, suppress spread of a depletion layer to the channel region 131. The halo regions 133a and 133b include, for example, N-type impurities such as arsenic (As) and phosphorus (P), and function as N-type semiconductors. A concentration of the N-type impurities in the halo regions 133a and 133b is higher than a concentration of impurities in the channel region 131.

The first silicon carbon layers 140a and 140b function as diffusion suppressing layers to suppress diffusion of impurities such as boron (B) from the first semiconductor layer 110 or the second semiconductor layer 120 to the third semiconductor layer 130. Therefore, the first silicon carbon layer 140a is extended in a manner that the first semiconductor layer 110 and the third semiconductor layer 130 are separated via the first silicon carbon layer 140a. Similarly, the first silicon carbon layer 140b is extended in a manner that the second semiconductor layer 120 and the third semiconductor layer 130 are separated via the first silicon carbon layer 140b. That is, the first silicon carbon layer 140a covers a lower surface 111 and X-direction side surface 112 of the first semiconductor layer 110. The first silicon carbon layer 140b covers a lower surface 121 and X-direction side surface 122 of the second semiconductor layer 120. Each of one end 141a of the first silicon carbon layer 140a and one end 141b of the first silicon carbon layer 140b is in contact with boundary parts between the semiconductor portion 100 and the electrode portion 200. The other end may reach an upper end of the semiconductor portion 100 or may reach an element isolation insulating layer not shown. Hereinafter, a partial region of the first silicon carbon layer 140a may be referred to as a fourth region R4. A partial region of the first silicon carbon layer 140b may be referred to as a fifth region R5.

The first silicon carbon layers 140a and 140b include, for example, silicon carbon (Si:C). The silicon carbon (Si:C) includes silicon (Si) as a main component and includes carbon (C). A carbon content of silicon carbon is, for example, higher than 0% and lower than 5%. Silicon carbon is different, for example, from silicon carbide and the like that include both of silicon and carbon as main components. Note that the first semiconductor layer 110 and the second semiconductor layer 120 do not include carbon almost at all. At least a carbon concentration in the first and second semiconductor layers 110 and 120 is lower than a carbon concentration in the first silicon carbon layers 140a and 140b.

The second silicon carbon layers 150a and 150b function as diffusion suppressing layers to suppress diffusion of impurities such as boron (B) from the first semiconductor layer 110 or the second semiconductor layer 120 to the insulating layer 400. The second silicon carbon layer 150a covers an upper surface of the first semiconductor layer 110. The second silicon carbon layer 150b covers an upper surface of the second semiconductor layer 120. One end of the second silicon carbon layer 150a and one end of the second silicon carbon layer 150b reach each of side wall insulating films 250 of the electrode portion 200. The other end reaches another insulating film or the like not shown. Hereinafter, a partial region of the second silicon carbon layer 150a may be referred to as a sixth region R6. A partial region of the second silicon carbon layer 150b may be referred to as a seventh region R7.

The second silicon carbon layers 150a and 150b include, for example, silicon carbon (Si:C). A carbon concentration in the second silicon carbon layers 150a and 150b may be different from the carbon concentration in the first silicon carbon layers 140a and 140b. Either the second silicon carbon layers 150a and 150b or the first silicon carbon layers 140a and 140b may include material that is not included in the remaining layers. Note that the carbon concentration in the first and second semiconductor layers 110 and 120 is lower than at least the carbon concentration in the second silicon carbon layers 150a and 150b.

In the present embodiment, upper surfaces of the second silicon carbon layers 150a and 150b are parts of an upper surface of the semiconductor portion 100. The upper surfaces are discontinuous relative to an upper surface of the third semiconductor layer 130 and are located above the upper surface of the third semiconductor layer 130. Unevenness may be provided on the upper surfaces. X-direction side surfaces of the second silicon carbon layers 150a and 150b are in contact with the side wall insulating films 250 of the electrode portion 200.

The electrode portion 200 is provided with a gate insulating film 210, the gate electrode 220 and a cap insulating film 230 that are laminated on the upper surface of the third semiconductor layer 130 in order. The electrode portion 200 is provided with side wall insulating films 240 and the side wall insulating films 250 that are laminated on both X-direction side surfaces of the gate insulating film 210, the gate electrode 220 and the cap insulating film 230 in order.

The gate insulating film 210 and the side wall insulating films 240 include, for example, silicon oxide ($SiO_2$) and the like. The cap insulating film 230 and the side wall insulating films 250 include, for example, silicon nitride (SiN) and the like.

The gate electrode 220 may include metal, may include polysilicon (p-Si) into which impurities such as boron (B) and phosphorus (P) are injected, and, may include a laminated film of metal and polysilicon. The gate electrode 220 is connected to the contact 300c. The contacts 300a, 300b and 300c are conductive contacts including metal or the like and extend in the Z direction. The contact 300a is used as a source contact. The contact 300b is used as a drain contact. The contact 300c is used as a gate contact. Each of the contacts 300a, 300b and 300c has a lamination structure that includes a first metal film 301 and a second metal film 302. The first metal film 301 is tungsten (W) or the like. The second metal film 302 is a diffusion preventing layer that includes, for example, titanium nitride (TiN) and the like. The first metal film 301 has a resistivity smaller than a resistivity of the second metal film 302.

The insulating layer 400 is, for example, an interlayer insulating layer of $SiO_2$ or the like. Note that, in the present embodiment, the insulating layer 400 does not include boron (B) almost at all. At least a boron concentration in the insulating layer 400 is lower than the boron concentration in the first semiconductor layer 110 and the second semiconductor layer 120.

[Manufacturing Method]

Next, a manufacturing method of the semiconductor device according to the first embodiment will be described with reference to FIGS. 2 to 8. For convenience of explanation, some components will be omitted in FIGS. 2 to 8.

Figure 2:
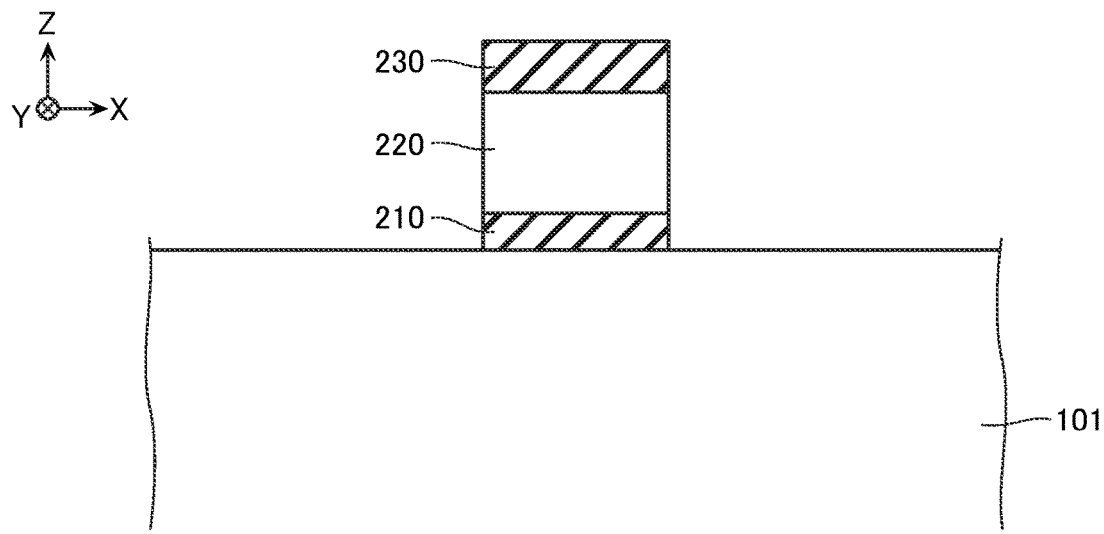
FIG. 2 is a schematic cross-sectional view showing a manufacturing method of the semiconductor device according to the first embodiment.

For example, as shown in FIG. 2, the gate insulating film 210, the gate electrode 220 and the cap insulating film 230 are formed on an upper surface of the semiconductor substrate 101. For example, the gate insulating film 210 is formed by thermal oxidation, and the gate electrode 220 and the cap insulating film 230 are deposited by CVD (Chemical Vapor Deposition) or the like. After that, processing by RIE (Reactive Ion Etching) or the like is performed.

Figure 3:
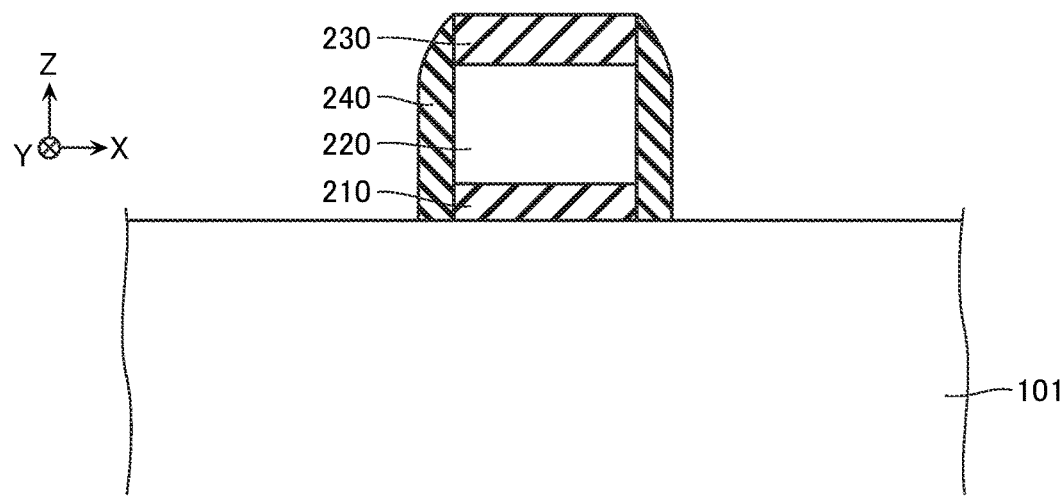
FIG. 3 is a schematic cross-sectional view showing the manufacturing method.

Next, as shown in FIG. 3, the side wall insulating films 240 are formed on both X-direction side surfaces of the gate insulating film 210, the gate electrode 220 and the cap insulating film 230. For example, films of $SiO_2$ or the like are deposited on the upper surface of the semiconductor substrate 101, both X-direction side surfaces of the gate electrode 220 and the like (210, 220 and 230) and a top surface of the cap insulating film 230 by CVD or the like. Next, RIE or the like is performed, and the films of $SiO_2$ or the like are removed, except for films deposited on both X-direction side surfaces of the gate electrode 220 and the like (210, 220 and 230).

Figure 4:
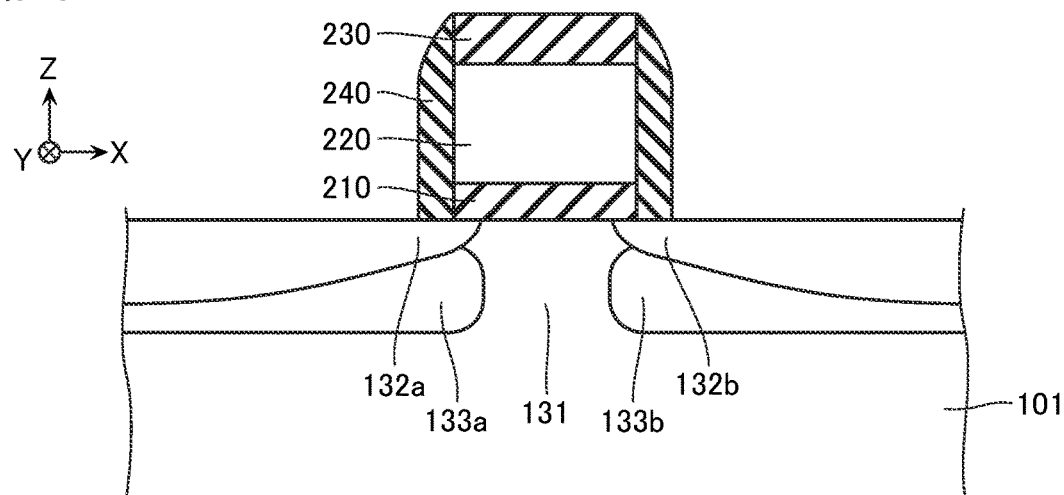
FIG. 4 is a schematic cross-sectional view showing the manufacturing method.

Next, as shown in FIG. 4, the extension regions 132a and 132b and the halo regions 133a and 133b are formed. For example, N-type impurities such as arsenic (As) and phosphorus (P) are injected into the semiconductor substrate 101 to form the halo regions 133a and 133b. Further, P-type impurities such as boron (B) are injected into the semiconductor substrate 101 to form the extension regions 132a and 132b. Note that a part between the extension regions 132a and 132b becomes the channel region 131.

Figure 5:
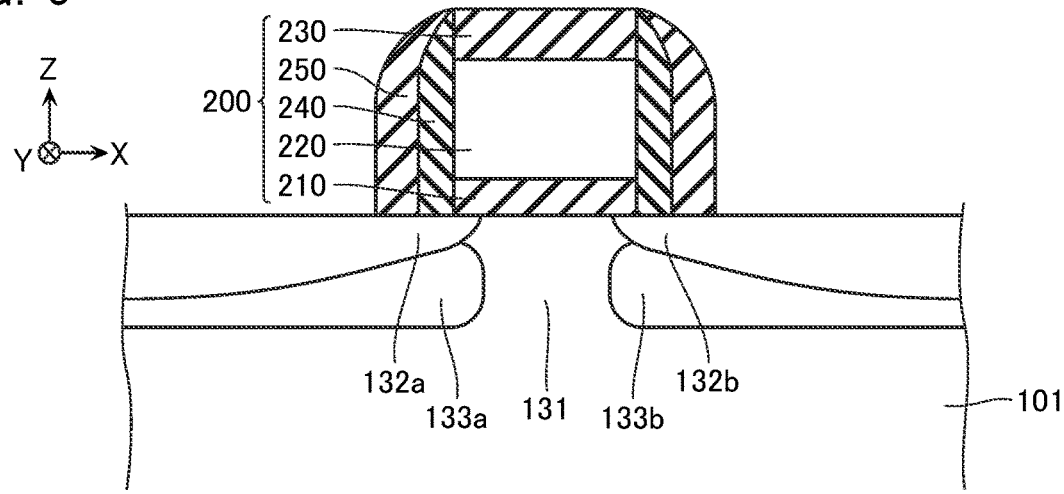
FIG. 5 is a schematic cross-sectional view showing the manufacturing method.

Next, as shown in FIG. 5, the side wall insulating films 250 are formed on X-direction side surfaces of the side wall insulating films 240. For example, films of $SiO_2$ or the like are deposited on the upper surface of the semiconductor substrate 101, X-direction side surfaces of the side wall insulating films 240 and the top surface of the cap insulating film 230 by CVD or the like. Next, RIE or the like is performed, and the films of $SiO_2$ or the like are removed, except for films deposited on the X-direction side surfaces of the side wall insulating films 240.

Figure 6:
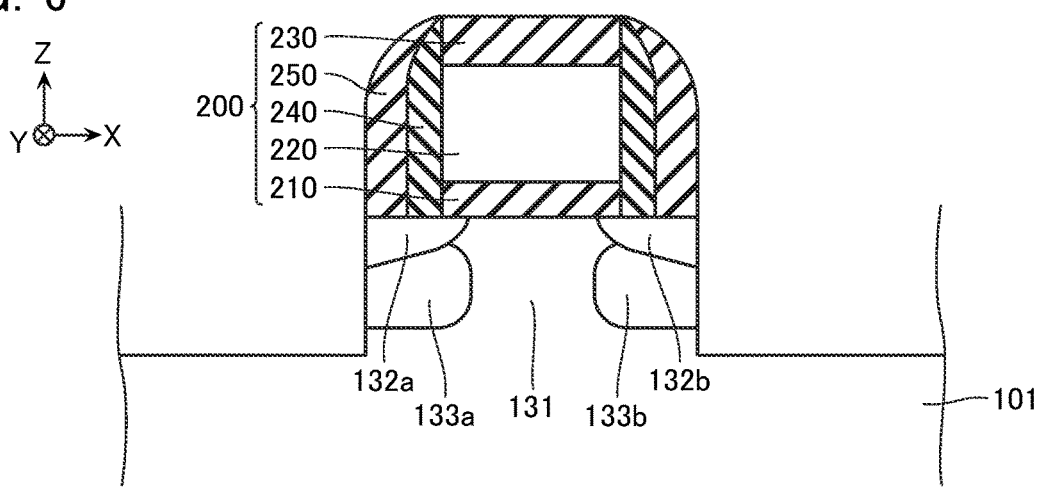
FIG. 6 is a schematic cross-sectional view showing the manufacturing method.

Next, as shown in FIG. 6, RIE or the like is performed, with the cap insulating film 230, the side wall insulating films 240 and the side wall insulating films 250 as masks to remove a part of the semiconductor substrate 101. A part left without being removed becomes the third semiconductor layer 130.

Figure 7:
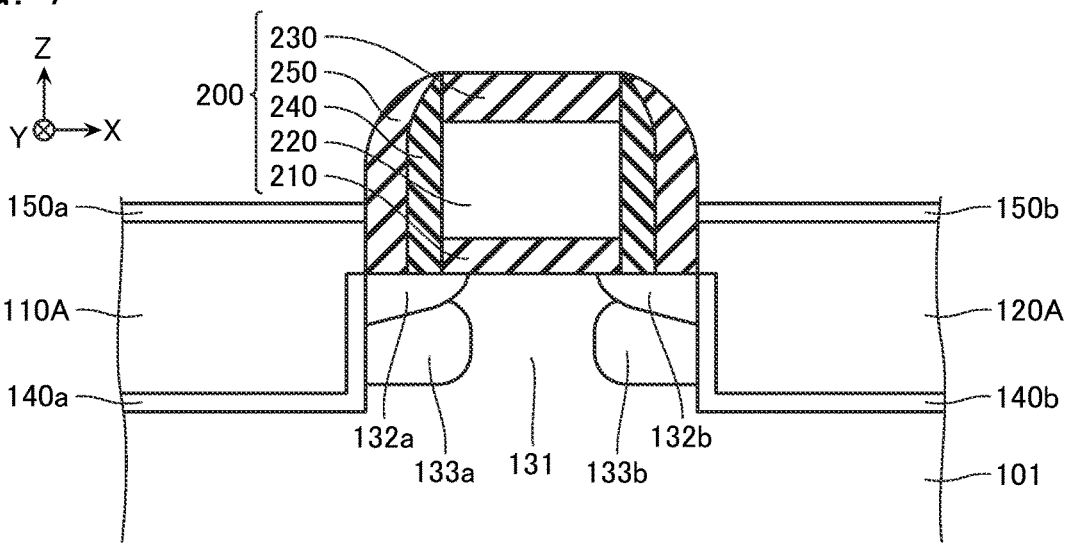
FIG. 7 is a schematic cross-sectional view showing the manufacturing method.

Next, as shown in FIG. 7, the first silicon carbon layers 140a and 140b, silicon layers 110A and 120A and the second silicon carbon layers 150a and 150b are formed. This process is performed, for example, by an epitaxial crystal growth method or the like based on an exposed surface of the semiconductor substrate 101.

Figure 8:
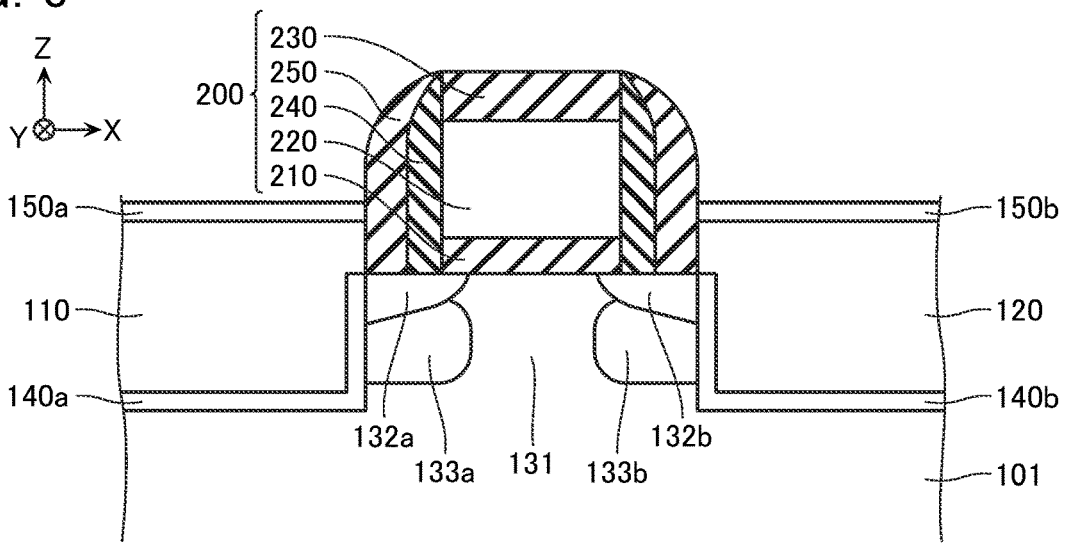
FIG. 8 is a schematic cross-sectional view showing the manufacturing method.

Next, as shown in FIG. 8, P-type impurities such as boron (B) are injected into the silicon layers 110A and 120A to form the first semiconductor layer 110 and the second semiconductor layer 120.

Next, the insulating layer 400 is formed on the upper surfaces and X-direction side surfaces of the structure exemplified in FIG. 8 by CVD or the like; contact holes for causing the first semiconductor layer 110, the second semiconductor layer 120 and the gate electrode 220 to be exposed are formed by RIE or the like; and the contacts 300a, 300b and 300c are formed inside the contact holes by CVD or the like. Thereby, the configuration shown in FIG. 1 is formed.

[Advantages]

In a P-channel type field effect transistor, P-type impurities such as boron (B) injected into a source region and a drain region is diffused to a channel region in some cases. When miniaturization of semiconductor devices is advanced, influence of such diffusion of impurities relatively increases in some cases. For example, in some cases, a depletion layer on a source region side and a depletion layer on a drain region side come close to each other or are connected, and a leak current when the P-channel type field effect transistor is in an off state increases. Hereinafter, this phenomenon will be referred to as "a short channel effect".

As described above with reference to FIG. 1, the first silicon carbon layer 140a (the fourth region R4) is provided between the first semiconductor layer 110 (the first region R1) including P-type impurities such as boron and the channel region 131 (the third region R3) in the present embodiment. Similarly, the first silicon carbon layer 140b (the fifth region R5) is provided between the second semiconductor layer 120 (the second region R2) including P-type impurities such as boron and the channel region 131 (the third region R3). According to such a configuration, it is possible to, by suppressing diffusion of impurities such as boron to suppress the short channel effect, provide a semiconductor device that can be easily miniaturized.

In order to realize such a configuration, for example, it is also conceivable to inject carbon and boron into a surface of a semiconductor substrate and form a source region and a drain region thereby. In this case, the source region and the drain region include a certain level of carbon. However, for example, when metal material and silicon carbon are caused to be in contact with each other, contact resistance increases in some cases.

Therefore, in the present embodiment, the carbon concentration in the first semiconductor layer 110 and the second semiconductor layer 120 is set low. At least the carbon concentration in the first and second semiconductor layers 110 and 120 is lower than the carbon concentration in the first silicon carbon layers 140a and 140b. Thereby, the increase in contact resistance described above can be suppressed. Additionally, if a carbon concentration is set too low in order to suppress increase in contact resistance, boron in the silicon layers 110A and 120A is diffused to the insulating layer 400, and, as a result, increase in contact resistance is caused. Therefore, contact regions are formed after parts of the second silicon carbon layers 150a and 150b are removed.

In order to realize such a configuration, in the present embodiment, the first silicon carbon layers 140a and 140b are formed by the epitaxial crystal growth method or the like, and, after that, the silicon layers 110A and 120A corresponding to the first semiconductor layer 110 and the second semiconductor layer 120 are formed by the epitaxial crystal growth method or the like in the process described with reference to FIG. 7.

According to such a method, it is possible to manufacture the first semiconductor layer 110 and the second semiconductor layer 120 not including carbon almost at all.

Note that, when a semiconductor device is manufactured by such a method, the upper surface of the third semiconductor layer 130, which is a part of the semiconductor substrate 101, and upper surfaces of parts formed by the epitaxial crystal growth method (140a, 140b, 110, 120, 150a and 150b) are discontinuous in some cases. Further, unevenness may be formed on the upper surfaces of these parts in some cases. Moreover, side surfaces of these parts are in contact with the side wall insulating films 250 in some cases.

There may be a case where, on the same semiconductor substrate as the transistor described above, another transistor, a memory cell array of a planar NAND flash or the like is provided. Moreover, there may be a case where a memory cell array of a three-dimensional NAND flash, or the like is provided above the semiconductor substrate 101. Here, P-type impurities such as boron injected into a source region or a drain region are diffused via an insulating layer above and may reach the other components. In such a case, characteristics of the other components may be influenced.

As described above with reference to FIG. 1, the second silicon carbon layer 150a (the sixth region R6) is provided between the first semiconductor layer 110 (the first region R1) including P-type impurities such as boron and the insulating layer 400 in the present embodiment. Similarly, the second silicon carbon layer 150b (the seventh region R7) is provided between the second semiconductor layer 120 (the second region R2) including P-type impurities such as boron and the insulating layer 400. According to such a configuration, it is possible to suppress diffusion of impurities such as boron to suppress influence on other components provided on the same semiconductor substrate 101 as the transistor Tr1.

Second Embodiment

[Configuration]

Figure 9:
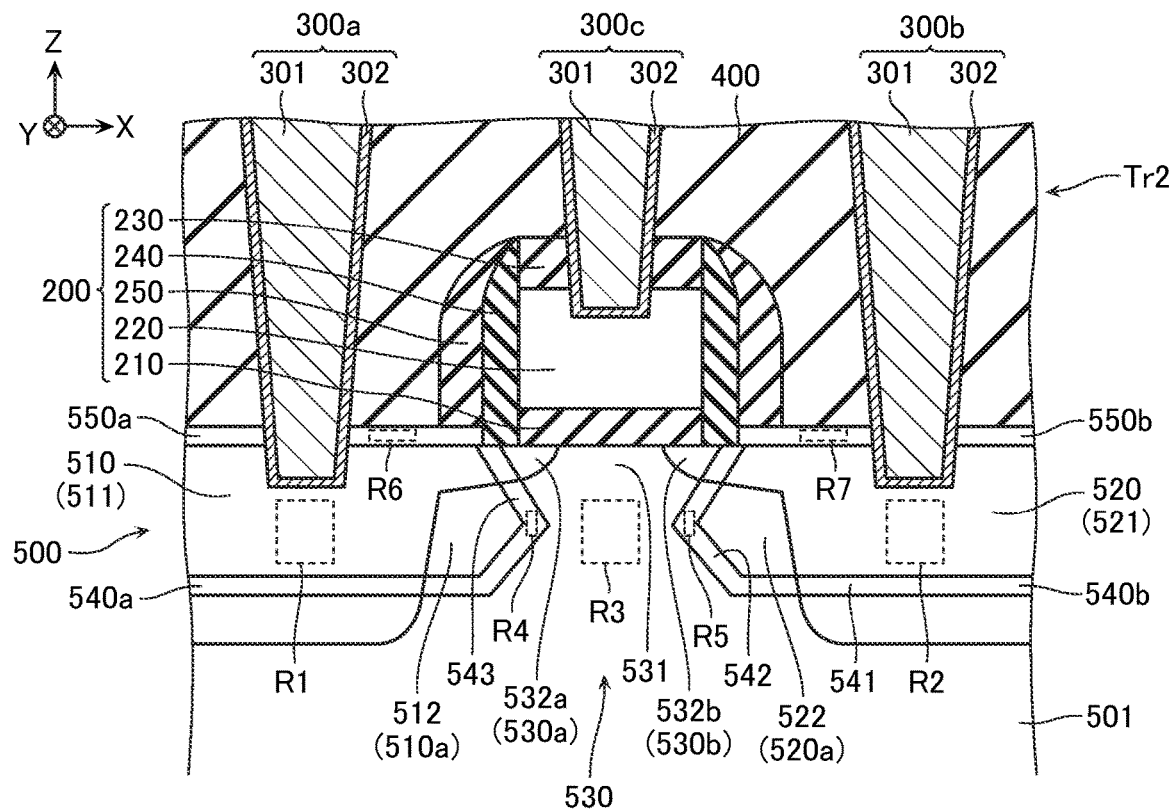
FIG. 9 is a schematic cross-sectional view showing a configuration of a semiconductor device according to a second embodiment.

Next, a configuration of a semiconductor device according to a second embodiment will be described with reference to FIG. 9. Note that in the description below, portions similar to those in the first embodiment are assigned the same reference numerals, and descriptions thereof will be omitted.

The semiconductor device according to the present embodiment includes an N-channel type field effect transistor Tr2. The transistor Tr2 is provided with a semiconductor portion 500 and the electrode portion 200 arranged in the Z direction. The semiconductor device is provided with the contacts 300a and 300b connected to the semiconductor portion 500, the contact 300c connected to the electrode portion 200, and the insulating layer 400 of $SiO_2$ or the like covering the contacts 300a, 300b and 300c.

The semiconductor portion 500 includes a semiconductor substrate 501. The semiconductor portion 500 is further provided with a plurality of components arranged in the X direction. That is, the semiconductor portion 500 is provided with: a first semiconductor layer 510 connected to the contact 300a, a second semiconductor layer 520 connected to the contact 300b, a third semiconductor layer 530 provided between the first semiconductor layer 510 and the second semiconductor layer 520, a first silicon carbon layer 540a provided between the first semiconductor layer 510 and the third semiconductor layer 530, and a first silicon carbon layer 540b provided between the second semiconductor layer 520 and the third semiconductor layer 530. The semiconductor portion 500 is further provided with a second silicon carbon layer 550a provided between the first semiconductor layer 510 and the insulating layer 400, and a second silicon carbon layer 550b provided between the second semiconductor layer 520 and the insulating layer 400.

The semiconductor substrate 501 is, for example, a semiconductor substrate provided with an N-type well region and a P-type well region on its surface, and includes silicon (Si) and the like including P-type impurities such as boron (B). The part shown in FIG. 9 may be a part of the semiconductor substrate 501 where the P-type well region is provided or may be a region where a well is not provided. The P-type well region includes silicon (Si) and the like including P-type impurities such as boron (B).

The first semiconductor layer 510 is provided above the semiconductor substrate 501. On an X-direction side surface of the first semiconductor layer 510, a projecting portion 510a projecting toward the third semiconductor layer 530 is provided. A distal end portion of the projecting portion 510a is provided below an upper surface of the third semiconductor layer 530. Hereinafter, a partial region of the first semiconductor layer 510 may be referred to as a first region R1.

The first semiconductor layer 510 is provided with a source region 511 connected to the contact 300a, and a halo region 512 provided on the projecting portion 510a. The source region 511 includes, for example, N-type impurities such as arsenic (As) and phosphorus (P) and P-type impurities such as boron (B), and functions as an N-type semiconductor. The halo region 512 includes P-type impurities such as boron, and functions as a P-type semiconductor. For example, the halo region 512 suppresses spread of a depletion layer to the third semiconductor layer 530.

The second semiconductor layer 520 is provided above the semiconductor substrate 501. On an X-direction side surface of the second semiconductor layer 520, a projecting portion 520a projecting toward the third semiconductor layer 530 is provided. A distal end portion of the projecting portion 520a is provided below an upper surface of the third semiconductor layer 530. Hereinafter, a partial region of the second semiconductor layer 520 may be referred to as a second region R2.

The second semiconductor layer 520 is provided with a drain region 521 connected to the contact 300b, and a halo region 522 provided on the projecting portion 520a. The drain region 521 includes, for example, N-type impurities such as arsenic (As) and phosphorus (P) and P-type impurities such as boron (B), and functions as an N-type semiconductor. The halo region 522 includes P-type impurities such as boron, and functions as a P-type semiconductor. For example, the halo region 522 suppresses spread of a depletion layer to the third semiconductor layer 530.

The third semiconductor layer 530 is, for example, a part of the semiconductor substrate 501 and includes silicon (Si) and the like including P-type impurities such as boron (B). On a side surface of the third semiconductor layer 530 on the first semiconductor layer 510 side, a projecting portion 530a projecting toward the first semiconductor layer 510 is provided. This projecting portion 530a is provided above the projecting portion 510a of the first semiconductor layer 510. On a side surface of the third semiconductor layer 530 on the second semiconductor layer 520 side, a projecting portion 530b projecting toward the second semiconductor layer 520 is provided. This projecting portion 530b is provided above the projecting portion 520a of the second semiconductor layer 520.

The third semiconductor layer 530 is provided with a channel region 531 facing the gate electrode 220, an extension region 532a provided on the projecting portion 530a and an extension region 532b provided on the projecting portion 530b.

The channel region 531 functions as a P-type semiconductor. A concentration of P-type impurities such as boron (B) in the channel region 531 is lower than a boron concentration in the first semiconductor layer 510 and the second semiconductor layer 520. Hereinafter, a part of the channel region 531 may be referred to as a third region R3.

The extension regions 532a and 532b, for example, reduce a threshold of the transistor Tr2. The extension regions 532a and 532b include, for example, N-type impurities such as arsenic (As) and phosphorus (P), and function as N-type semiconductors. A concentration of the N-type impurities in the extension regions 532a and 532b is lower than a concentration of the N-type impurities in the source region 511 and the drain region 521.

The first silicon carbon layers 540a and 540b function as diffusion suppressing layers to suppress diffusion of impurities such as boron (B) from the first semiconductor layer 510 or the second semiconductor layer 520 to the third semiconductor layer 530. Hereinafter, a partial region of the first silicon carbon layer 540a may be referred to as a fourth region R4, and a partial region of the first silicon carbon layer 540b may be referred to as a fifth region R5.

The first silicon carbon layers 540a and 540b include, for example, silicon carbon (Si:C). Note that the first semiconductor layer 510 and the second semiconductor layer 520 do not include carbon almost at all. At least a carbon concentration in the first and second semiconductor layers 510 and 520 is lower than a carbon concentration in the first silicon carbon layers 540a and 540b.

The first silicon carbon layer 540a covers a lower surface and X-direction side surfaces of the first semiconductor layer 510. The first silicon carbon layer 540b covers a lower surface and X-direction side surfaces of the second semiconductor layer 520. The first silicon carbon layer 540a is extended in a manner that the first semiconductor layer 510 and the third semiconductor layer 130 are separated via the first silicon carbon layer 540a. Similarly, the first silicon carbon layer 540b is extended in a manner that the second semiconductor layer 520 and the third semiconductor layer 530 are separated via the first silicon carbon layer 540b. Hereinafter, each of parts of the first silicon carbon layers 540a and 540b covering lower surfaces of the first semiconductor layer 510 and the second semiconductor layer 520 will be referred to as a first part 541, and parts of each of the first silicon carbon layers 540a and 540b covering an X-direction side surface will be referred to as a second part 542 and a third part 543.

The first part 541 extends in the X direction. The first part 541 is in contact with the source region 511 or the drain region 521, and includes N-type impurities such as arsenic (As) and phosphorus (P).

The second part 542 includes one end connected to one end of the first part 541 and extends in one direction. The other end of the second part 542 reaches a distal end portion of the projecting portion 510a of the first semiconductor layer 510 or a distal end portion of the projecting portion 520a of the second semiconductor layer 520. The one end is located below the other end. In the X direction, the one end is further from the gate electrode 220 than the other end.

The third part 543 includes one end connected to the other end of the second part 542, and extends in one direction. The other end of the third part 543 reaches the upper surface of the semiconductor portion 500. The one end is located below the other end. In the X direction, the one end is nearer to the gate electrode 220 than the other end. The third part 543 is in contact with the source region 511 and the extension region 532a, or the drain region 521 and the extension region 532b, and includes N-type impurities such as arsenic (As) and phosphorus (P).

The second silicon carbon layers 550a and 550b function as diffusion suppressing layers to suppress diffusion of impurities such as boron (B) from the first semiconductor layer 510 or the second semiconductor layer 520 to the insulating layer 400. The second silicon carbon layer 550a covers an upper surface of the first semiconductor layer 510. The second silicon carbon layer 550b covers an upper surface of the second semiconductor layer 520. One end of the second silicon carbon layer 550a and one end of the second silicon carbon layer 550b reach each of the side wall insulating films 240 of the electrode portion 200. The other end reaches another insulating film or the like not shown. Hereinafter, a partial region of the second silicon carbon layer 550a may be referred to as a sixth region R6. A partial region of the second silicon carbon layer 550b may be referred to as a seventh region R7.

The second silicon carbon layers 550a and 550b include, for example, silicon carbon (Si:C) and N-type impurities such as arsenic (As) and phosphorus (P). A carbon concentration in the second silicon carbon layers 550a and 550b may be different from the carbon concentration in the first silicon carbon layers 540a and 540b. Either the second silicon carbon layers 550a and 550b or the first silicon carbon layers 540a and 540b may include material that is not included in the remaining layers. Note that the carbon concentration in the first and second semiconductor layers 510 and 520 is lower than at least the carbon concentration in the second silicon carbon layers 550a and 550b.

In the present embodiment, upper surfaces of the second silicon carbon layers 550a and 550b are parts of an upper surface of the semiconductor portion 500. The upper surfaces are discontinuous relative to an upper surface of the third semiconductor layer 530 and are located above the upper surface of the third semiconductor layer 530. Unevenness may be provided on the upper surfaces. X-direction side surfaces of the second silicon carbon layers 550a and 550b are in contact with the side wall insulating films 240 of the electrode portion 200.

[Manufacturing Method]

Next, a manufacturing method of the semiconductor device according to the second embodiment will be described with reference to FIGS. 10 to 14. For convenience of explanation, some components will be omitted in FIGS. 10 to 14.

For example, a process similar to the process described with reference to FIGS. 2 and 3 is performed using the semiconductor substrate 501.

Figure 10:
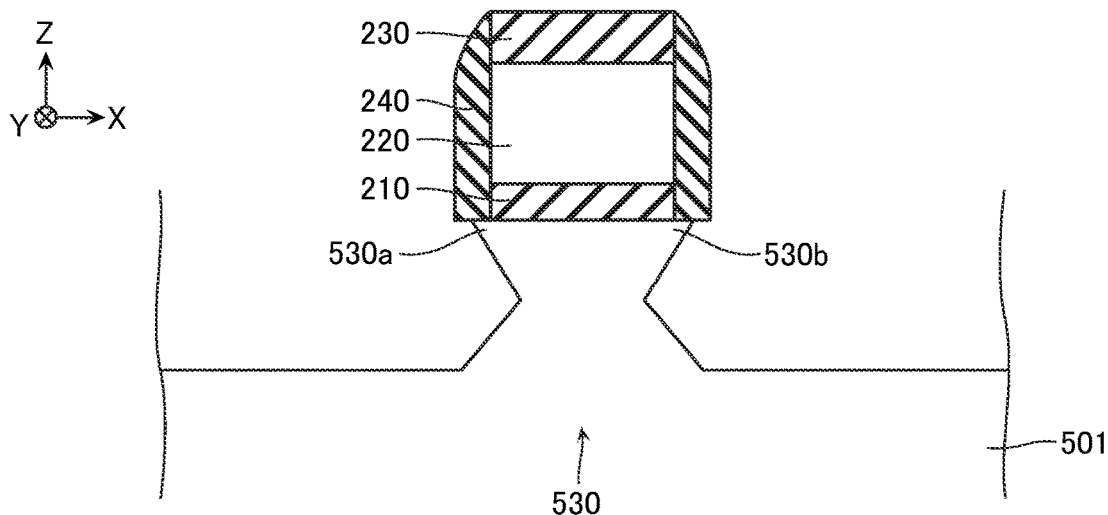
FIG. 10 is a schematic cross-sectional view showing a manufacturing method of the semiconductor device according to the second embodiment.

Next, as shown in FIG. 10, a part of the semiconductor substrate 501 is removed by RIE, anisotropic wet etching, or the like. At this time, the third semiconductor layer 530 with the projecting portions 530a and 530b formed on X-direction side surfaces is formed.

Figure 11:
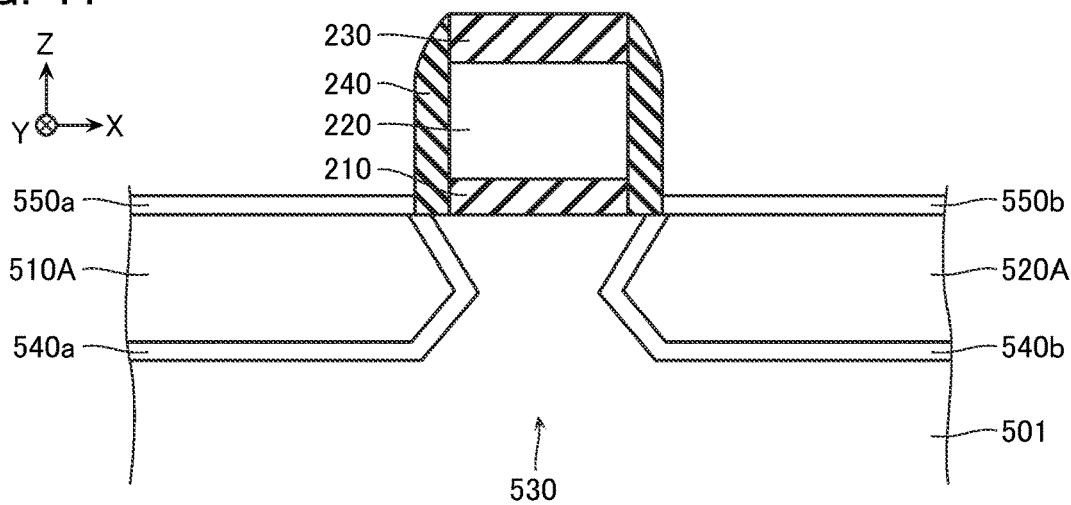
FIG. 11 is a schematic cross-sectional view showing the manufacturing method.

Next, as shown in FIG. 11, the first silicon carbon layers 540a and 540b, silicon layers 510A and 520A and the second silicon carbon layers 550a and 550b are formed. This process is performed, for example, by the epitaxial crystal growth method or the like based on an exposed surface of the semiconductor substrate 501.

Figure 12:
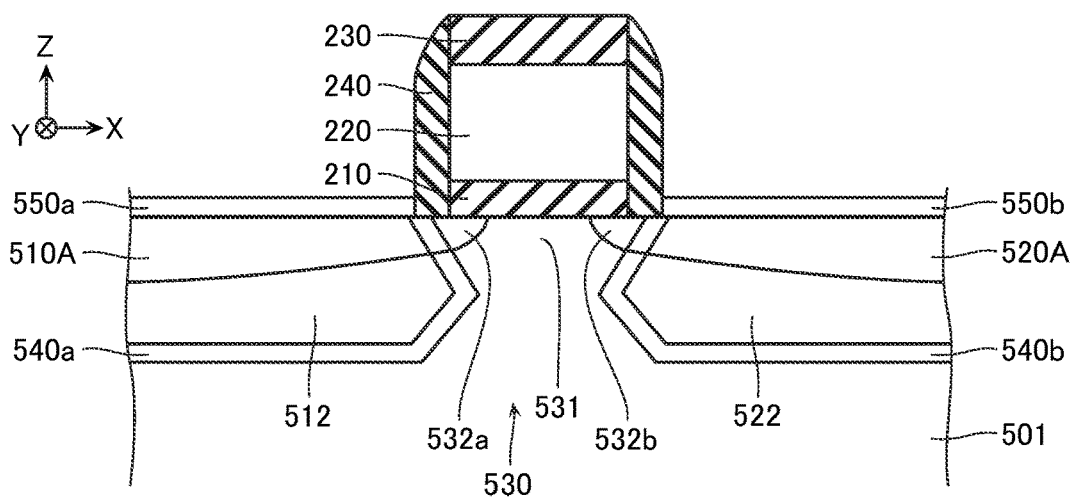
FIG. 12 is a schematic cross-sectional view showing the manufacturing method.

Next, as shown in FIG. 12, the halo regions 512 and 522 and the extension regions 532a and 532b are formed.

Formation of the halo regions 512 and 522 is performed, for example, by injecting P-type impurities such as boron (B) into the first semiconductor layers 510A and 520A. The injected impurities are diffused to a region between the first silicon carbon layer 540a and the second silicon carbon layer 550a and a region between the first silicon carbon layer 540b and the second silicon carbon layer 550b, and the halo regions 512 and 522 are formed.

Formation of the extension regions 532a and 532b is performed, for example by injecting N-type impurities such as arsenic (As) and phosphorus (P) into the semiconductor substrate 501. The injected impurities pass through the first silicon carbon layers 540a and 540b and the second silicon carbon layers 550a and 550b and are diffused to a part of the semiconductor substrate 501, and the extension regions 532a and 532b are formed. Note that, a part between the extension regions 532a and 532b becomes the channel region 531.

Figure 13:
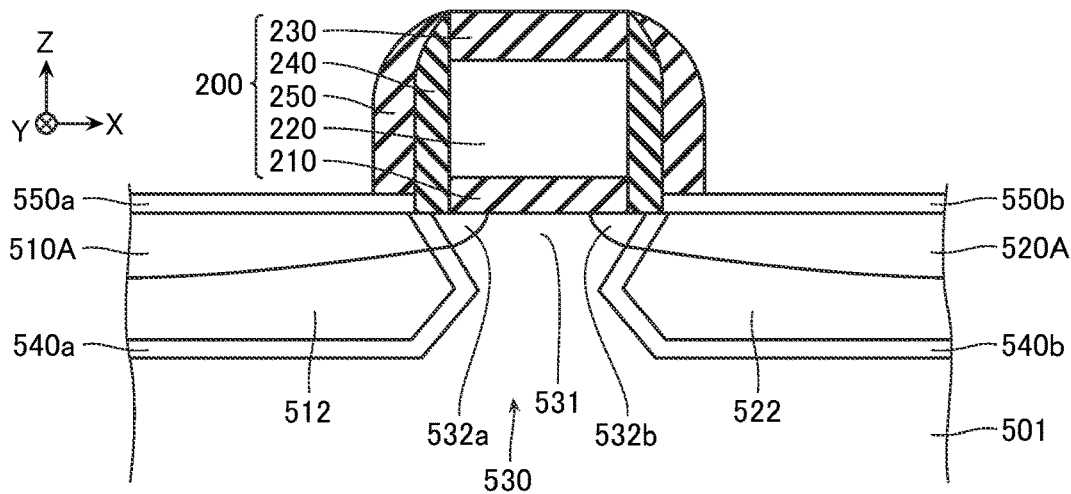
FIG. 13 is a schematic cross-sectional view showing the manufacturing method.

Next, as shown in FIG. 13, the side wall insulating films 250 are formed on X-direction side surfaces of the side wall insulating films 240. This process is performed, for example, similar to the process described with reference to FIG. 5.

Figure 14:
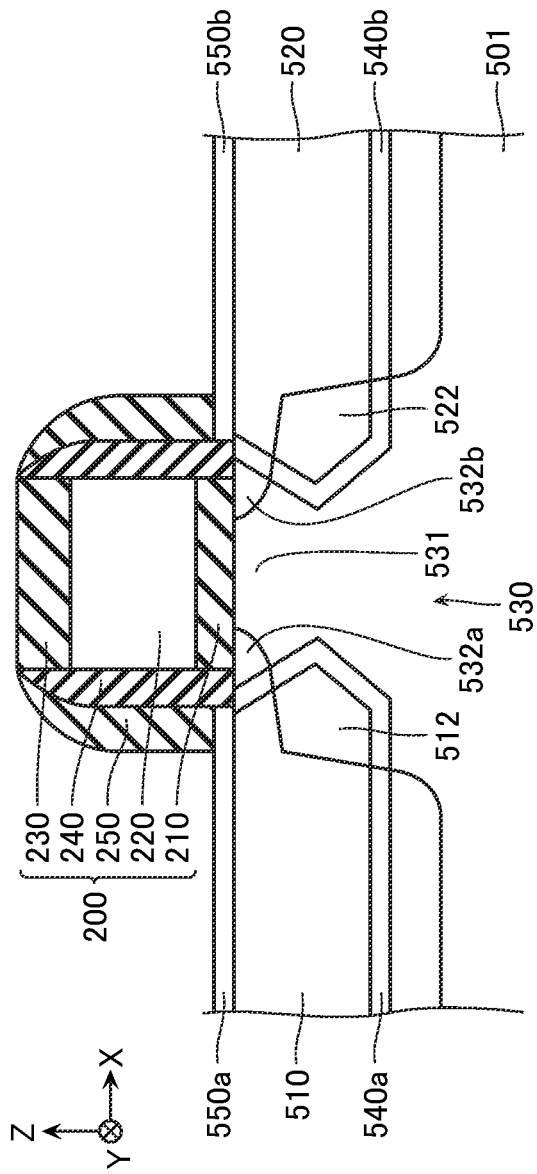
FIG. 14 is a schematic cross-sectional view showing the manufacturing method.

Next, as shown in FIG. 14, N-type impurities such as arsenic (As) and phosphorus (P) are injected into the silicon layers 510A and 520A to form the first semiconductor layer 510 and the second semiconductor layer 520. The injected impurities pass through the first silicon carbon layers 540a and 540b and the second silicon carbon layers 550a and 550b and are diffused to a part of the semiconductor substrate 501.

[Advantages]

In an N-channel type field effect transistor, P-type impurities such as boron (B) injected into a halo region is diffused to a channel region in some cases. When miniaturization of semiconductor devices is advanced, influence of such diffusion of impurities relatively increases in some cases. For example, in some cases, a concentration of impurities in the channel region becomes too high, and a current when the N-channel type field effect transistor is in an ON state decreases. Hereinafter, this phenomenon will be referred to as "a reverse short channel effect".

As described above with reference to FIG. 9, the first silicon carbon layer 540a (the fourth region R4) is provided between the first semiconductor layer 510 (the first region R1) including P-type impurities such as boron and the channel region 531 (the third region R3) in the present embodiment. Similarly, the first silicon carbon layer 540b (the fifth region R5) is provided between the second semiconductor layer 520 (the second region R2) including P-type impurities such as boron and the channel region 531 (the third region R3). According to such a configuration, it is possible to, by suppressing diffusion of impurities such as boron to suppress the reverse short channel effect, provide a semiconductor device that can be easily miniaturized.

In the present embodiment also, it is possible to suppress increase in contact resistance between the contacts 300a and 300b, and the source region 511 and the drain region 521 similarly to the first embodiment.

In the present embodiment also, it is possible to manufacture the first semiconductor layer 510 and the second semiconductor layer 520 not including carbon almost at all.

In the present embodiment also, the upper surface of the third semiconductor layer 530, which is a part of the semiconductor substrate 501, and upper surfaces of parts formed by the epitaxial crystal growth method (540a, 540b, 510, 520, 550a and 550b) are discontinuous in some cases. Further, unevenness may be formed on the upper surfaces of these parts in some cases. Moreover, side surfaces of these parts are in contact with the side wall insulating films 250 in some cases.

In the present embodiment also, it is possible to suppress influence on other components provided on the same semiconductor substrate 501 as the transistor Tr2.

OTHER EMBODIMENTS

In the first embodiment, the first silicon carbon layers 140a and 140b, the silicon layers 110A and 120A and the second silicon carbon layers 150a and 150b are formed by the epitaxial crystal growth method or the like. However, it is also possible to adopt other methods. The same goes for the second embodiment.

In the first embodiment, the first semiconductor layer 110 and the second semiconductor layer 120 are provided above the semiconductor substrate 101, and the third semiconductor layer 130 is a part of the semiconductor substrate 101. However, for example, the third semiconductor layer 130 may be provided above the substrate. In this case, for example, all of the first semiconductor layer 110, the second semiconductor layer 120 and the third semiconductor layer 130 may be provided above the semiconductor substrate 101, or at least one of the first semiconductor layer 110 and the second semiconductor layer 120 may be a part of the semiconductor substrate 101. In this case, the first silicon carbon layers 140a and 140b may be a single layer covering both X-direction side surfaces and lower surface of the third semiconductor layer 130. The same goes for the second embodiment.

Further, it is also possible to form the P-channel type field effect transistor and N-channel type field effect transistor described so far on the same substrate to form a CMOS (complementary MOS) circuit. In this case, a part of the manufacturing process sometimes can be shared in common. For example, the process described with reference to FIGS. 2 and 3 sometimes can be shared in common. Further, the process described with reference to FIGS. 7 and 11 sometimes can be shared in common. Further, the process described with reference to FIGS. 5 and 13 sometimes can be shared in common.

Further, a storage device and the like may be provided above a substrate on which at least one of the P-channel type field effect transistor and N-channel type field effect transistor described so far is formed. Manufacturing of a storage device and the like may include a thermal process, and, ordinarily, there is concern about diffusion of impurities such as boron and appearance of the short channel effect and the reverse short channel effect accompanying the diffusion of impurities. However, according to the configuration described so far, the diffusion and the appearance can be suppressed in some cases.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a substrate;
   a first semiconductor layer provided above the substrate, the first semiconductor layer including a first region;
   a second semiconductor layer provided away from the first semiconductor layer in a first direction, the second semiconductor layer including a second region;
   a third region provided between the first region and the second region;
   an electrode provided above the third region;
   a fourth region provided between the first region and the third region, the fourth region including carbon;
   a fifth region provided between the second region and the third region, the fifth region including carbon;
   a sixth region including boron and provided between the third region and the fourth region;
   a seventh region including phosphorus and provided between the third region and the fourth region; and
   an insulating film provided on a side surface of the electrode;
   wherein
   a carbon concentration in the first region and a carbon concentration in the second region are lower than a carbon concentration in the fourth region and a carbon concentration in the fifth region, and
   at least one of the first semiconductor layer or the second semiconductor layer is provided with a part that is in contact with a side surface in the first direction of the insulating film.

2. The semiconductor device according to claim 1, wherein the fourth and fifth regions include silicon carbon.

3. The semiconductor device according to claim 1, wherein a carbon content in the fourth region and a carbon content in the fifth region are higher than 0% and lower than 5%.

4. The semiconductor device according to claim 1, wherein
   the first and second regions include boron; and
   a boron concentration in the third region is lower than a boron concentration in the first region and a boron concentration in the second region.

5. The semiconductor device according to claim 1, further comprising:
   a first contact connected to the first region; and
   a second contact connected to the second region;
   wherein
   the first and second contacts include metal.

6. The semiconductor device according to claim 1, further comprising:
   an insulating layer provided above the first and second regions;
   an eighth region provided between the first region and the insulating layer, the eighth region including carbon; and
   a ninth region provided between the second region and the insulating layer, the ninth region including carbon.

7. The semiconductor device according to claim 6, wherein the sixth and seventh regions include silicon carbon.

8. The semiconductor device according to claim 6, wherein a carbon content in the sixth region and a carbon content in the seventh region are higher than 0% and lower than 5%.

9. The semiconductor device according to claim 6, wherein a boron concentration in the insulating layer is lower than a boron concentration in the first region and a boron concentration in the second region.

10. The semiconductor device according to claim 6, further comprising insulating films provided on side surfaces of the electrode in the first direction;
    wherein
    one end of the eighth region and one end of the ninth region are in contact with each of the insulating films.

11. A semiconductor device comprising:
    a first semiconductor layer;
    a second semiconductor layer provided away from the first semiconductor layer in a first direction;
    a third semiconductor layer provided between the first semiconductor layer and the second semiconductor layer;
    an electrode provided above the third semiconductor layer;
    a fourth semiconductor layer provided between the first semiconductor layer and the third semiconductor layer, the fourth semiconductor layer including carbon;
    a fifth semiconductor layer provided between the second semiconductor layer and the third semiconductor layer, the fifth semiconductor layer including carbon; and
    an insulating film provided on a side surface of the electrode; wherein
    the third semiconductor layer includes:
    a first region;
    a second region including boron and provided between the first region and the fourth semiconductor layer; and
    a third region including phosphorus and provided between the first region and the fourth semiconductor layer,
    a carbon concentration in the first semiconductor layer and a carbon concentration in the second semiconductor layer are lower than a carbon concentration in the fourth semiconductor layer and a carbon concentration in the fifth semiconductor layer, and
    at least one of the first semiconductor layer or the second semiconductor layer is provided with a part that is in contact with a side surface in the first direction of the insulating film.

12. The semiconductor device according to claim 11, wherein
    the third semiconductor layer is a part of a substrate;
    the fourth semiconductor layer is provided along a first surface of the substrate facing the first semiconductor layer; and the fifth semiconductor layer is provided along a second surface of the substrate facing the second semiconductor layer.

13. The semiconductor device according to claim 11, further comprising:
a sixth semiconductor layer covering an upper surface of the first semiconductor layer; and
a seventh semiconductor layer covering an upper surface of the second semiconductor layer; wherein
at least a part of each of upper surfaces of the sixth and seventh semiconductor layers is located above an upper surface of the third semiconductor layer.

14. The semiconductor device according to claim 11, wherein at least one of the first semiconductor layer or the second semiconductor layer is provided with a projecting portion projecting toward the third semiconductor layer in the first direction.

15. The semiconductor device according to claim 1, wherein the seventh region is provided between the sixth region and the third region.

16. The semiconductor device according to claim 1, wherein the boron concentration in the sixth region is lower than a boron concentration in the first region.

17. The semiconductor device according to claim 1, wherein the fourth region provided between the first region and the sixth region, and the fourth region provided between the first region and the seventh region.

* * * * *